United States Patent [19]
Shibasaki et al.

[11] Patent Number: 5,829,156
[45] Date of Patent: Nov. 3, 1998

[54] SPIN DRYER APPARATUS

[75] Inventors: Mitsunao Shibasaki, Ebina; Naoaki Ogure, Tokyo, both of Japan

[73] Assignee: Ebara Corporation, Tokyo, Japan

[21] Appl. No.: 820,087

[22] Filed: Mar. 19, 1997

[30] Foreign Application Priority Data

Mar. 19, 1996 [JP] Japan .................................. 8-090477

[51] Int. Cl.$^6$ .................................................. F26B 17/24
[52] U.S. Cl. .......................................................... 34/58
[58] Field of Search ........................... 34/314, 317, 326, 34/58, 59; 134/902

[56] References Cited

U.S. PATENT DOCUMENTS

| 5,083,381 | 1/1992 | Aigo | 34/58 X |
| 5,375,291 | 12/1994 | Tateyama et al. | |
| 5,435,075 | 7/1995 | Shiraishi et al. | 34/58 |
| 5,651,160 | 7/1997 | Yonemizu et al. | 134/902 X |
| 5,667,535 | 9/1997 | Kasahara | 34/58 X |

FOREIGN PATENT DOCUMENTS

| 4-53684 | 2/1902 | Japan . |
| 3-30426 | 2/1991 | Japan . |

Primary Examiner—Henry A. Bennett
Assistant Examiner—Steve Gravini
Attorney, Agent, or Firm—Wenderoth, Lind & Ponack, LLP

[57] ABSTRACT

A spin dryer apparatus substrate such as a wafer can dry without degrading the cleanliness on both front and back sides of the wafer and without unnecessary cost increases. The spin dryer apparatus includes a holder section for holding a substrate in a substantially horizontal plane and defining a back space located beneath a back surface of the substrate, a driving section for rotating the holder section in the substantially horizontal plane, and a gas supply mechanism for supplying a clean gas into the back space. It is possible to avoid contamination of the back side of the substrate by preventing an ascending gas flow from approaching the substrate. A nozzle device is available for supplying a cleaning fluid on the substrate

31 Claims, 4 Drawing Sheets

F I G. 4
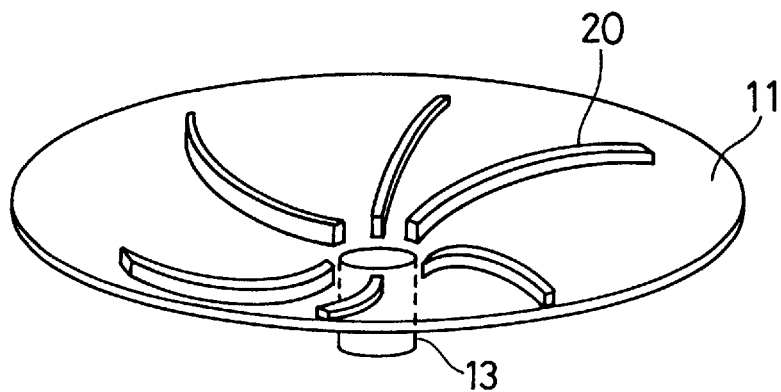
F I G. 5
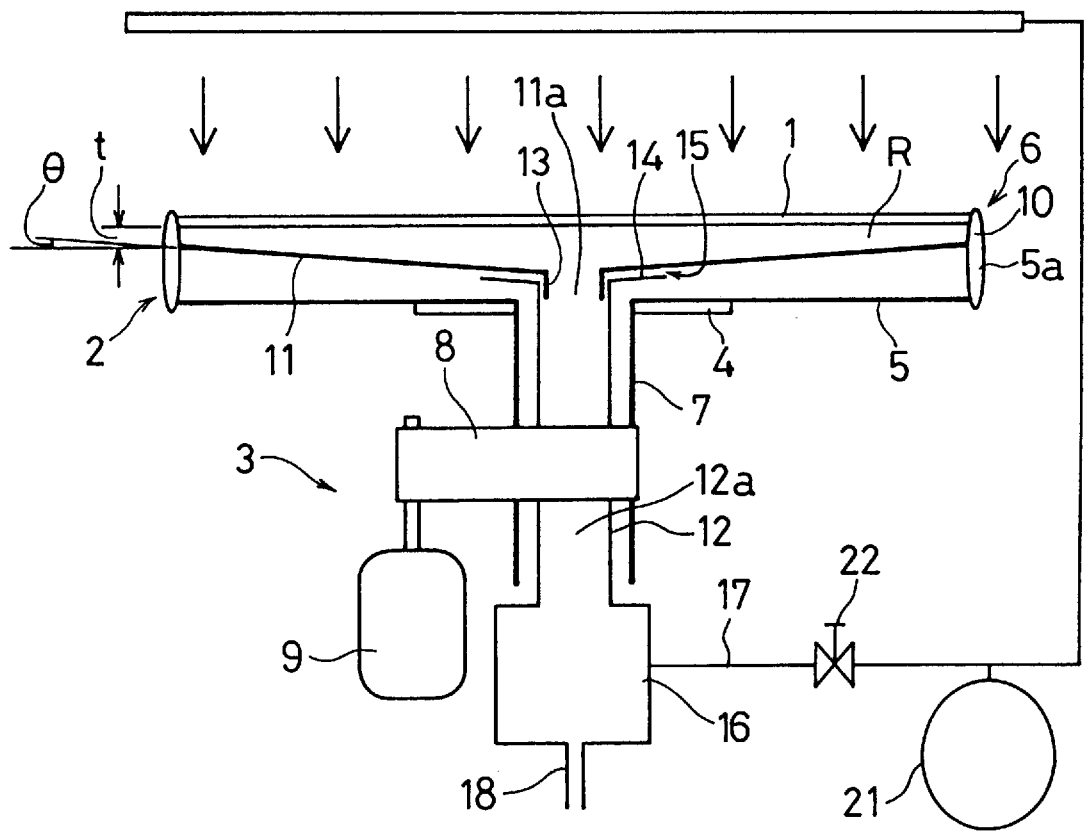

SPIN DRYER APPARATUS

BACKGROUND OF THE INVENTION

1. Field of the Invention

The present invention relates to a spin dryer apparatus for drying substrates such as semiconductor wafers, glass substrates and liquid crystal panels that require a high degree of cleanliness, by holding and spinning the substrates horizontally.

2. Description of the Related Art

Advanced semiconductor technology has developed highly integrated semiconductor devices which require an enhanced circuit density on a substrate, resulting in narrowing of the interline separation distance. Therefore, the possibility that residual particles remaining on the substrate may cause a short circuit and other operational problems in the circuit also has been enhanced. This means that allowable ranges of particle sizes and numbers have become severely lowered. The same restrictions apply also to processing of other substrates such as glass substrates and liquid crystal panels.

For example, a wafer cleaning process subsequent to removal of a photoresist film used for etching and ion implantation of a semiconductor wafer involves removal of particles and chemicals by cleaning with detergents, followed by rinsing with purified water and drying. Since the drying process is the last step in the wafer cleaning process, it is preferable to conduct such process in a highly clean atmosphere. Such a technology is reported in Japanese Patent Application Laid Open Publication, H4-100231, which discloses a method of generating a uniform laminar flow on the surface of a wafer. In such method, a clean gas is charged from an upper gas charge port to the wafer while the wafer is spun horizontally inside a cleaning chamber, and the gas is discharged through a lower discharge port.

However, when the wafer is spinning horizontally, air adjacent to the back surface of the wafer is dragged by the wafer and starts to rotate so as to have a radial outward speed component due to centrifugal force. Therefore, even though an overall flow of the clean gas in the cleaning chamber is directed from the top to the bottom of the chamber, on the back side of the wafer, a local circulating flow flowing upwardly along the rotation shaft is generated, which then turns to the outer radial direction and finally descends at the periphery of the wafer. Such a local circulating flow tends to pick up contaminants released from rotation mechanisms such as bearings, leading to contamination on the back side of the wafer.

If, in order to prevent the formation of such circulating flow, a large volume of gas flow is introduced into the chamber, gas consumption increases unduly. If a clean gas such as nitrogen gas is used, the operating cost increases significantly, and if a compressed air is used, the air itself may become a source for contamination because of its lower cleanliness.

SUMMARY OF THE INVENTION

The object of the present invention is to provide a spin dryer apparatus which can dry wafers without degrading the cleanliness on both front and back sides of the wafer and without presenting unnecessary cost increases.

The object of the present invention has been accomplished by a spin dryer apparatus comprising: a holder section for holding a substrate in a substantially horizontal plane, the holder section defining a back space located beneath a back surface of the substrate; a driving section for rotating the holder section in the substantially horizontal plane; and a gas supply mechanism for supplying a clean gas into the back space. Accordingly, it is possible to avoid contamination of the back side of the substrate by preventing an ascending gas flow which has become contaminated while flowing in the vicinity of the spin driving device from approaching the substrate.

An aspect of the invention is that the gas supply mechanism is based on a centrifugal force resulting from spinning of the holder section and/or the substrate. Accordingly, by utilizing the mechanisms already available in the spin dryer apparatus, it becomes possible to provide a gas flow to the back space without resorting to a separate driving device.

Another aspect of the invention is that the gas supply mechanism is provided with a gas inlet opening remote from the spin driving section. Accordingly, clean gas can be introduced from a suitable location within the cleaning chamber without providing a separate clean gas source.

Still another aspect of the invention is that the gas supply mechanism is communicated with an independent clean gas supply source. Accordingly, the pressure of the gas source can be used to force the gas to flow to the back space.

Another aspect of the invention is that the holder section is provided with a partition member for covering at least a part of the back space. Accordingly, the back space is efficiently defined by the partition member so that the back space can be kept clean efficiently.

An aspect of the invention is that the partition member is formed in a funnel shape. Accordingly, liquid supplied to the apparatus especially during a standby mode of operation can be drained through a central hole. At the same time, a vertical peripheral spacing between the substrate and the partition member can be narrowed so as to prevent the intrusion of the surrounding gas as well as promoting unidirectional gas flow rather than circulating gas flow within the back space.

An aspect of the invention is that the apparatus is provided with a gas supply tube for supplying a gas into the back space, and the partition member and the gas supply tube are operatively coupled through a fine gap. The fine gap may be designed narrow as a labyrinth seal which can prevent intrusion of gas into the back space without affecting rotation of partition member.

Another aspect of the above apparatus is that the gas supply tube is provided with a liquid/gas separation compartment. Accordingly, cross contamination between the liquid and gas phases is prevented.

Still another aspect of the invention is that an angle of inclination of the surface of the partition member is selected so as to permit descending of droplets of wetting liquid during low speed spinning in a standby mode of operation, and to permit droplets of rinsing liquid to spin off outwardly during high speed spinning in a drying mode operation. Accordingly, the apparatus can be kept clean constantly to avoid contamination from one drying operation to the next.

Another aspect of the invention is that the partition member is provided with a surface configuration comprising protrusions and depressions to generate an outward flow of clean gas by a rotation of the partition member. Accordingly, it is possible to provide a forced flow of gas by utilizing the spin driving device of the dryer apparatus.

A variation of the spin dryer apparatus comprises a holder section for holding a substrate approximately horizontally, a spin driving section for rotating the holder section in an approximately horizontal plane; a gas supply mechanism for flowing clean gas through a back space located beneath a back surface of the substrate; and a nozzle for supplying a cleaning fluid on the substrate.

BRIEF DESCRIPTION OF THE DRAWINGS

FIG. 4 is a perspective view of another embodiment of the partition member.

FIG. 5 is a schematic side view of another embodiment of the dryer apparatus of the present invention.

DESCRIPTION OF THE PREFERRED EMBODIMENTS

Figure 1:
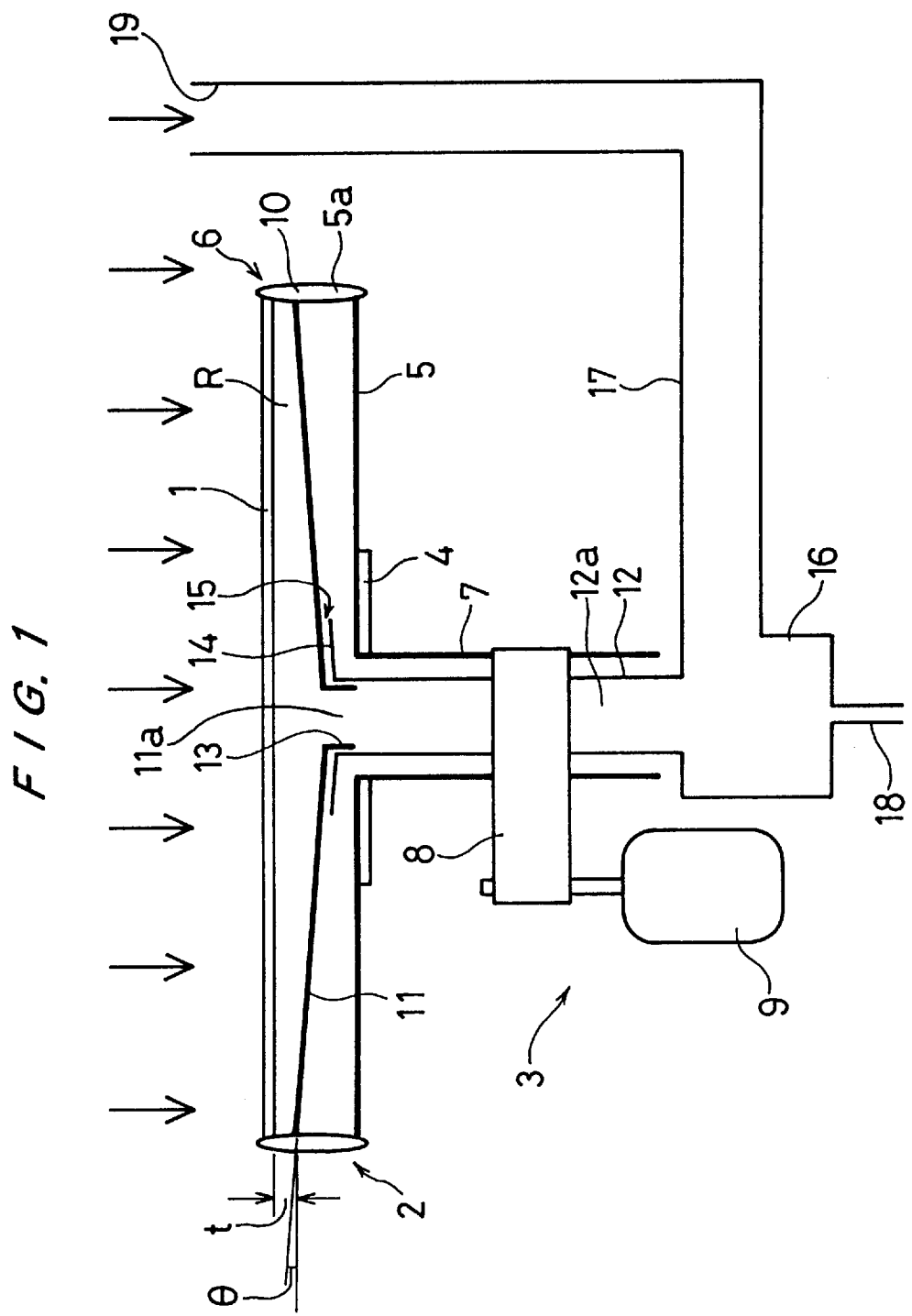
FIG. 1 is a schematic side view of an embodiment of the dryer apparatus of the present invention.
Figure 2:
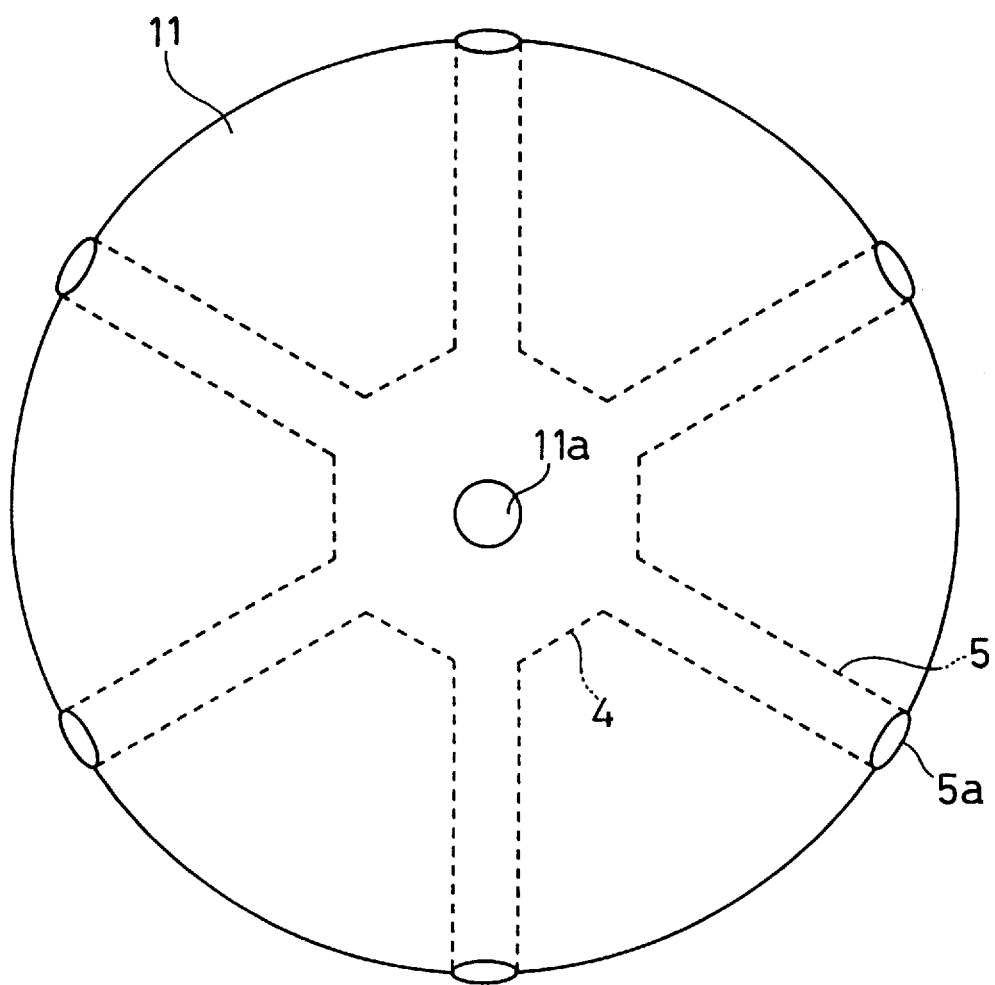
FIG. 2 is a plan view of the substrate holder shown in FIG. 1.
Figure 3:
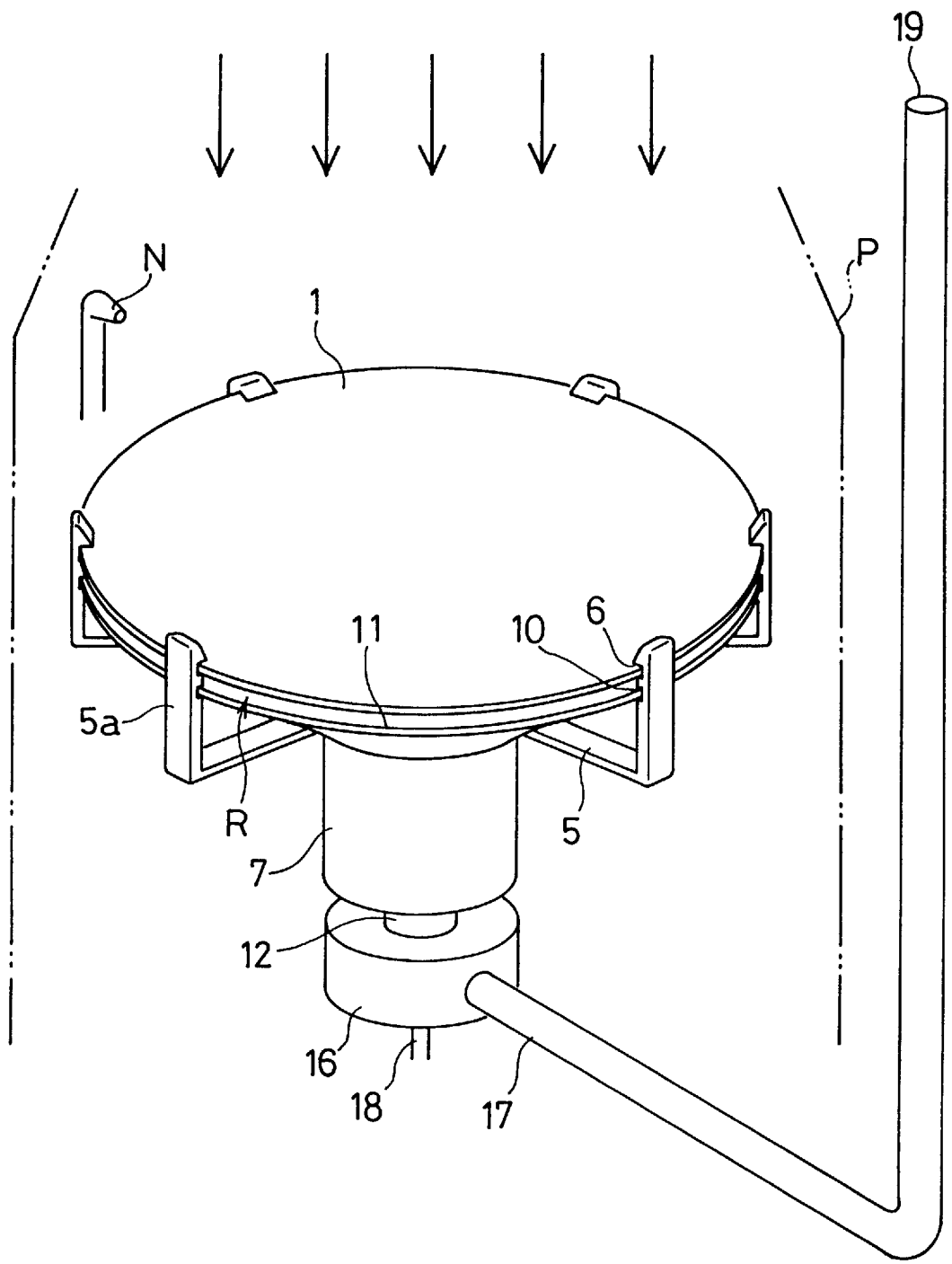
FIG. 3 is a perspective view of the apparatus shown in FIG. 1.

FIGS. 1 to 3 show the construction of a first embodiment of the spin dryer apparatus, a so-called spin dryer comprising a holder section 2 for holding a substrate (semiconductor wafer) 1 in a horizontal plane and a driving section 3 for rotating the holder section 2 about a spinning axis to rotate the wafer within the horizontal plane. The spin dryer apparatus is disposed inside a cleaning chamber, which is not illustrated, in which a clean gas flow is directed from the top region to the bottom region of the chamber as shown by a parallel arrows in FIG. 1. In the chamber, a nozzle N for supplying clean rinsing water on the surface of the substrate 1 and an elevatable splash guard cup P (shown in FIG. 3) for preventing splashing of the water are also provided.

The holder section 2 is a so-called mechanical chuck type holder comprising a central hub section 4 and a number of L-shaped holder arms 5 radially extending from the central hub section 4. A substrate holder device 6 for releasably gripping the substrate at the periphery thereof is disposed at a top end of a vertical arm member 5a of each of the holder arms 5. The substrate holder device 6 comprises a mechanical latching or spring loaded member. The central hub section 4 is attached to a rotative hollow shaft 7 disposed in a vertical direction. The rotative hollow shaft 7 is rotatably supported with a bearing unit (not shown) and is operatively connected to a motor 9 in the spin driving section 3 through a transmission device 8. The transmission device 8 is a timing belt in this embodiment, but it may be equally be a gear arrangement.

The vertical arm member 5a is provided with a shield attachment section 10 disposed underneath the substrate holder device 6. A partition member 11 is attached to the shield attachment section 10. The partition member 11 is formed as a funnel shaped pan having a slightly tapered surface and a center opening 11a, and is attached to shield attachment section 10 to define an annular back space R between the substrate 1 and the partition member 11. The material of the partition member 11 should present no possibility of contaminating the substrate 1 and have good formability. Lightness and hydrophilic nature of the surface are also desirable. The shield attachment section 10 is formed as a groove on the vertical arm member 5a and is located below the substrate holder device 6, as shown in FIG. 3.

Inside the rotative hollow shaft 7, there is disposed a gas supply tube 12 (stationary sleeve) having a flow passage 12a for flowing two-way countercurrent flows comprised of a downward cleaning fluid flow and an upward clean gas flow. The gas supply tube 12 serves to supply a clean atmosphere gas within the cleaning chamber to a low pressure region near the central back side of the substrate as well as to discharge the supplied cleaning and wetting liquid. It is designed so as to minimize the resistance to gas flow within the gas supply tube 12 for smoothly passing the gas therethrough even under a minimal pressure differential. Suitable materials including fluororesin are used for the gas supply tube 12.

In the center of the partition member 11, there is provided a spout section 13 extending into the gas supply tube 12, and at the top end of the gas supply tube 12, there is a flange section 14 extending along the bottom surface of the partition member 11. This coupling arrangement produces a narrow gap 15 having an L-shaped cross section between the gas supply tube 12 and the spout section 13 on the one hand, and between the flange section 14 and the partition member 11. Within the gap 15, there is generated an outwardly directed flow introduced by the centrifugal force produced by the rotation of the flange section 14 so that atmosphere gas ascending on the outside of the gas supply tube 12 is prevented from entering the back space R formed between the substrate 1 and the partition member 11. The gap 15 may be formed in a labyrinth configuration to prevent, even more certainly, the intrusion of the gas rising about the outer surface of the gas supply tube 12.

There is a gas/liquid separation compartment 16 provided at the base of the gas supply tube 12. On a side section of the separation compartment 16 is provided a gas inlet pipe 17, and a liquid discharge pipe 18 at the bottom of compartment 16 for discharging the cleaning liquid. The gas inlet pipe 17 communicates with a gas inlet opening 19 which is located at a location within the chamber remote from and higher than the driving section 3 of the dryer apparatus for taking in a clean gas supplied to the chamber shown by arrows in FIGS. 1 and 3.

The angle θ of inclination of the funnel-shaped partition member is chosen so as to permit the outward spinning off of liquid droplets during a high-speed rinsing process with the substrate 1 held in the holder device 6, and to permit the downward draining of the droplets during a low-speed wetting process. The latter process is to prevent the partition member 11 from becoming dry while the substrate 1 is not present in the holder device 6 in a standby operation mode. A spacing t between the peripheral portions of substrate 1 and partition member 11 is chosen to be, for example, about 1 mm, so as to permit the droplets to spin off by overcoming the force surface tension.

As described above, by providing a funnel shape to the partition member 11, it becomes possible not only to efficiently remove wetting water sprayed during the standby mode operation through the center opening, but also to make the peripheral spacing t narrow, thereby to prevent entry of surrounding atmosphere gas into the back space R, and also to rectify the circulating flow on the back side of the partition member 11. It can be seen that rinse water droplets can be spun off in the radial direction because the centrifugal force is large enough at the outer periphery to overcome the forces of surface tension existing between the partition member 11 and the back surface of the substrate 1.

Next, the operation of the spin dryer apparatus of the embodiment presented above will be described. In the standby mode operation, there is no substrate 1 placed on the dryer apparatus, and water is supplied from the nozzle N to the partition member 11 to prevent drying of the holder section 2 and the partition member 11. The partition in member 11 is spinning at a relatively low rotational speed of 30 rotations per minute (r.p.m.), for example. At this speed, the water supplied to the partition member 11 is not spun off by the centrifugal force, and trickles down on the funnel shaped surface to enter the gas supply tube 12 through the spout section 13. The water further enters the gas/liquid separation compartment 16 and is discharged through the liquid discharge pipe 18.

A substrate 1 which has been subjected to processing steps such as etching and ion implantation is transported to the dryer apparatus, and is mounted on the holder section 2 and held by such means as mechanical chucking, and the splash guard cup P, shown in FIG. 3, is elevated. Here, the holder section 2 is rotated at a speed of 3,000 r.p.m. for example, and the substrate 1 is rinsed by spraying rinse water thereon through the nozzle N. For this process, it is possible to use high pressure water or chemical detergent supplied onto the substrate 1 for cleaning purposes. At such a high rotational speed, the liquid supplied to the substrate 1 is spun off from the periphery of the substrate 1 by centrifugal force, and the liquid dropping onto the partition member 11 from the substrate I is also spun off outwardly and does not flow downwardly through the funnel surface. The fluid spun away strikes the guard cup P and descends thereon to be discharged.

After finishing a certain duration of the rinsing operation, supply of water through the nozzle N is stopped while continuing to spin the holder section 2 at a high speed. This high-speed spinning prompts the gas in the back space R to move in the outer radial direction by the centrifugal force created by the rotation. Accordingly, a gas circulation passage is formed by communication of the gas inlet opening 19, gas supply pipe 17, gas/liquid separation compartment 16, gas supply tube 12, the back space R and the chamber.

Since the gas inlet 19 opens at a location higher than and remote from the components of the dryer apparatus which are subjected to frictional wear, such as driving section 3 including motor 9, timing belt 8, bearings and other devices, the circulation passage is always supplied with clean gas. Even if a gas flow pattern rising about the outer region of the gas supply tube 12 is formed, this ascending flow is prevented from flowing into the back space R formed at the back side of the substrate 1.

Further, in order to strengthen the effect of preventing a reverse flow into the back space R, it is possible to forcibly generate a flow of clean atmosphere gas by providing spiral or radially extending vanes 20 or grooves on the upper surface of the partition member 11, as shown in FIG. 4. Also, in the above embodiment, the gas is supplied into the back space R by the action of the rotating substrate 1 and the partition member 11. However, as shown in FIG. 5, it is possible to supply gas from a separate gas supply source 21 for the chamber to the gas inlet pipe 17 through a flow control valve 22. Further, it is also possible to supply the gas from an independent gas source having an independent gas supplying mechanism such as a compressor.

Although a certain preferred embodiment of the present invention has been shown and described in detail, it should be understood that various changes and modifications may be made therein without departing from the scope of the appended claims.

What is claimed is:

1. A spin dryer apparatus comprising:
   a holder section for holding a substrate in a substantially horizontal plane;
   a driving section for rotating said holder section in said substantially horizontal plane, said driving section including a support shaft attached to said holder section, and an actuator for rotating said support shaft;
   a partition member mounted to be rotatable with said holder section at a position to confront a back surface of the substrate supported by said holder section, said partition member having a size to define with the back surface a back space covering substantially the entire area of the back surface; and
   a mechanism for supplying a clean gas into said back space as a function of and in response to rotation of said holder section, said mechanism including a gas supply tube extending through said support shaft and opening into said back space.

2. An apparatus as claimed in claim 1, wherein said partition member has a surface configuration facilitating an outward flow of the clean gas in response to rotation of said partition member.

3. An apparatus as claimed in claim 1, wherein said partition member has on a surface thereof at least one vane or groove facilitating outward flow of the clean gas in response to rotation of said partition member.

4. An apparatus as claimed in claim 1, wherein said gas supply tube has an inlet opening at a location remote from said driving section.

5. An apparatus as claimed in claim 1, wherein said gas supply tube has an inlet opening located at a height higher than said driving section.

6. An apparatus as claimed in claim 1, further comprising structure for creating a downward clean gas flow around said holder section.

7. An apparatus as claimed in claim 1, wherein said partition member has a funnel shape.

8. An apparatus as claimed in claim 7, wherein said partition member includes a spout section protruding downwardly into said gas supply tube.

9. An apparatus as claimed in claim 8, wherein said gas supply tube has at an end thereof directed toward said partition member an outwardly projecting flange extending along a lower surface of said partition member.

10. An apparatus as claimed in claim 7, wherein said funnel shape of said partition member is inclined downwardly at an angle to enable draining of droplets of a wetting liquid during low speed rotation of said holder section and to enable droplets of wetting liquid to spin outwardly during high speed rotation of said holder section.

11. An apparatus as claimed in claim 1, wherein said gas supply tube is provided with a liquid/gas separation chamber.

12. An apparatus as claimed in claim 1, further comprising a nozzle device for supplying a cleaning liquid to the substrate supported by said holder device.

13. An apparatus as claimed in claim 12, further comprising an elevatable splash guard for preventing splashing of the cleaning liquid.

14. An apparatus as claimed in claim 1, wherein said holder section includes a central hub connected to said support shaft, and a plurality of holder arms extending radially outwardly from said central hub.

15. An apparatus as claimed in claim 14, wherein said holder section further includes arm members extending upwardly from radially outer ends of said holder arms and including structure to support an outer periphery of the substrate.

16. A substrate cleaning apparatus comprising:
   a holder section for holding a substrate in a substantially horizontal plane;

a nozzle device for supplying a cleaning liquid onto the substrate held by said holder section;

a driving section for rotating said holder section in said substantially horizontal plane, said driving section including a support shaft attached to said holder section, and an actuator for rotating said support shaft;

a partition member mounted to be rotatable with said holder section at a position to confront a back surface of the substrate supported by said holder section, said partition member having a size to define with the back surface a back space covering substantially the entire area of the back surface; and a mechanism for supplying a clean gas into said back space as a function of and in response to rotation of said holder section, said mechanism including a gas supply tube extending through said support shaft and opening into said back space.

17. A spin dryer apparatus comprising:

a holder section for holding a substrate in a substantially horizontal plane;

a driving section for rotating said holder section in said substantially horizontal plane, said driving section including a support shaft attached to said holder section, and an actuator for rotating said support shaft;

a partition member mounted at a position to confront a back surface of the substrate supported by said holder section, said partition member having a size to define with the back surface a back space covering substantially the entire area of the back surface, and said partition member having a funnel shape for facilitating liquid discharge therethrough; and a gas supply mechanism for supplying a clean gas into said back space, said mechanism including a gas supply tube extending through said support shaft and opening into said back space.

18. An apparatus as claimed in claim 17, wherein said partition member has a surface configuration facilitating an outward flow of the clean gas in response to rotation of said partition member.

19. An apparatus as claimed in claim 17, wherein said partition member has on a surface thereof at least one vane or groove facilitating outward flow of the clean gas in response to rotation of said partition member.

20. An apparatus as claimed in claim 17, wherein said gas supply tube has an inlet opening at a location remote from said driving section.

21. An apparatus as claimed in claim 17, wherein said gas supply tube has an inlet opening located at a height higher than said driving section.

22. An apparatus as claimed in claim 17, further comprising structure for creating a downward clean gas flow around said holder section.

23. An apparatus as claimed in claim 17, wherein said partition member includes a spout section protruding downwardly into said gas supply tube.

24. An apparatus as claimed in claim 23, wherein said gas supply tube has at an end thereof directed toward said partition member an outwardly projecting flange extending along a lower surface of said partition member.

25. An apparatus as claimed in claim 17, wherein said funnel shape of said partition member is inclined downwardly at an angle to enable draining of droplets of a wetting liquid during low speed rotation of said holder section and to enable droplets of wetting liquid to spin outwardly during high speed rotation of said holder section.

26. An apparatus as claimed in claim 17, wherein said gas supply tube is provided with a liquid/gas separation chamber.

27. An apparatus as claimed in claim 17, further comprising a nozzle device for supplying a cleaning liquid to the substrate supported by said holder device.

28. An apparatus as claimed in claim 27, further comprising an elevatable splash guard for preventing splashing of the cleaning liquid.

29. An apparatus as claimed in claim 17, wherein said holder section includes a central hub connected to said support shaft, and a plurality of holder arms extending radially outwardly from said central hub.

30. An apparatus as claimed in claim 28, wherein said holder section further includes arm members extending upwardly from radially outer ends of said holder arms and including structure to support an outer periphery of the substrate.

31. A substrate cleaning apparatus comprising:

a holder section for holding a substrate in a substantially horizontal plane;

a nozzle device for supplying a cleaning liquid onto the substrate held by said holder section;

a driving section for rotating said holder section in said substantially horizontal plane, said driving section including a support shaft attached to said holder section, and an actuator for rotating said support shaft;

a partition member mounted at a position to confront a back surface of the substrate supported by said holder section, said partition member having a size to define with the back surface a back space covering substantially the entire area of the back surface, and said partition member having a funnel shape for facilitating liquid discharge therethrough; and a gas supply mechanism for supplying a clean gas into said back space, said mechanism including a gas supply tube extending through said support shaft and opening into said back space.

* * * * *